(12) United States Patent
Ishii

(10) Patent No.: US 7,265,701 B2
(45) Date of Patent: Sep. 4, 2007

(54) ANALOG TO DIGITAL CONVERSION CIRCUIT

(75) Inventor: Hirotomo Ishii, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/387,242

(22) Filed: Mar. 22, 2006

(65) Prior Publication Data
US 2006/0290554 A1    Dec. 28, 2006

(30) Foreign Application Priority Data
Mar. 25, 2005   (JP)   ............... 2005-088176

(51) Int. Cl.
*H03M 1/34* (2006.01)
(52) U.S. Cl. .................. 341/158; 341/155
(58) Field of Classification Search ......... 341/130–170
See application file for complete search history.

(56) References Cited

U.S. PATENT DOCUMENTS

| 5,349,354 | A | * | 9/1994 | Ito et al. .......... 341/156 |
| 5,696,508 | A | | 12/1997 | Gross et al. |
| 5,861,829 | A | | 1/1999 | Sutardja |
| 6,218,975 | B1 | * | 4/2001 | Tsukamoto et al. ........ 341/159 |
| 6,255,979 | B1 | | 7/2001 | Allee et al. |
| RE37,716 | E | | 5/2002 | Sutardja et al. |
| 6,411,233 | B1 | | 6/2002 | Sutardja et al. |
| 6,433,711 | B1 | | 8/2002 | Chen |
| 6,504,499 | B1 | * | 1/2003 | Masenas et al. ........... 341/155 |
| 6,563,446 | B1 | | 5/2003 | Sutardja et al. |
| 6,891,494 | B2 | | 5/2005 | Choi |

FOREIGN PATENT DOCUMENTS

| JP | H6-276098 | 9/1994 |
| JP | H10-65542 | 3/1998 |
| JP | 2003-283335 | 10/2003 |

* cited by examiner

*Primary Examiner*—Lam T. Mai
(74) *Attorney, Agent, or Firm*—DLA Piper US LLP

(57) ABSTRACT

A plurality of reference voltages are generated by a reference voltage generation circuit. A plurality of comparators is supplied respectively with an analog input voltage and any two reference voltages out of the plurality of reference voltages. A threshold voltage of each of the comparators is adjusted according to the two reference voltages. Each of the comparators compares the analog input voltage with the threshold voltage. A plurality of comparison output signals of the plurality of comparators are supplied to an encoder circuit, and digital signals which correspond to the plurality of comparison output signals are output.

20 Claims, 6 Drawing Sheets

ANALOG TO DIGITAL CONVERSION CIRCUIT

CROSS-REFERENCE TO RELATED APPLICATIONS

This application is based upon and claims the benefit of priority from prior Japanese Patent Application No. 2005-088176, filed Mar. 25, 2005, the entire contents of which are incorporated herein by reference.

BACKGROUND OF THE INVENTION

1. Field of the Invention

The present invention relates to an analog to digital conversion circuit (hereinafter referred to as A/D converter), and more particularly to an A/D converter for correcting a direct current offset of a comparative reference voltage of a comparator. In addition, the present invention is used in a field in which a high-speed and high-definition A/D conversion is required in, for example, a parallel-type A/D converter.

2. Description of the Related Art

Conventionally, various types of A/D converters for converting an analog signal to a digital signal are used depending on the resolution and the operation speed thereof. For example, in the case where the resolution is given on a relatively low level on the order of 8 bits or less, and the conversion rate is given on a relatively high level of hundreds of MHz (sample/sec) to several GHz (sample/sec), a parallel type A/D converter is preferable which is simple in structure and which can be easily heightened in speed.

The parallel-type A/D converter which has the simplest structure is a flash-type A/D converter for comparing in a lump the analog input voltage with a plurality of reference voltages.

The flash-type A/D converter includes comparators in the number of resolution portions, a resistor string for generating reference voltages, and an encoder for encoding comparative outputs of the comparators. Analog signals which have been input are input in parallel to all the comparators, and the analog signals are compared with reference voltages at each of the comparators, and as a result, a signal obtained by encoding the comparison result by the encoder is output as an A/D conversion result.

When, in the aforementioned flash-type A/D converter, a direct current offset voltage is generated in the threshold voltage of the comparator due to a mismatch of the element properties, the conversion precision is directly affected. As a method for solving this problem, a method is considered which adds to the A/D converter a digital circuit for correcting the offset voltage to perform calibration. In this method, one of the problems is how the offset correction is realized in a circuit.

Jpn. Pat. Appln. KOKAI Publication No. 6-276098 discloses a technique for dividing a resistor string to generate reference voltages for offset correction in order to perform offset correction of a comparator. That is, an A/D converter comprises a resistor string, a selector, a comparator, an encoder, and a memory. The resistor string is configured so that a plurality of voltages can be taken out which are divided to a number not less than the resolution of the A/D converter. More specifically, resistor elements not less than the resolution are connected in series, and divided voltage is taken out from each of the connection points. Then, an appropriate value of divided voltage is selected by the selector, so that the offset of the comparator is corrected. A control signal of the selector is held in the memory.

With such a configuration, even if an offset occurs in the comparator, the offset is corrected and the precision of the A/D converter can be improved. However, the problem in such a configuration is that the circuit scale of the resistor string, the number of selectors, and the number of control signals of the selectors are increased in proportion to an increase in the number of the steps of correcting the offset voltage.

As has been described above, it is required to provide means for correcting the offset voltage of the comparator in the A/D converter for obtaining a desired conversion precision by means of calibration and trimming. Conventionally, there is a problem in that a larger number of reference voltages are used which number is larger than the desired resolution, and the offset voltage of the comparator is corrected with the result that the circuit scale is increased.

Furthermore, Jpn. Pat. Appln. KOKAI Publication No. 10-65542 discloses a comparator having a function of correcting an offset. In tile comparator disclosed in the above publication, a pair of PMOS transistors is used as a load circuit of two NMOS transistors which are input elements and constitute a differential pair. When an appropriate control signal is given to gate electrodes of the pair of PMOS transistors, the input and output properties of the comparators are changed in accordance with the appropriate signal and a threshold voltage of the comparator is changed, so that the offset of the comparator can be corrected.

However, a relation between a method of controlling a gate signal of the PMOS transistors and the threshold voltage of the comparator depends on the properties of the PMOS transistor serving as a load circuit and the properties of the NMOS transistor serving as an input element. Therefore, there is a problem in that a circuit design of the comparator is difficult, or the change properties of the threshold voltage of the comparator can be easily changed with the operation environment of temperatures, bias conditions or the like.

BRIEF SUMMARY OF THE INVENTION

According to one aspect of the present invention, there is provided an analog to digital conversion circuit comprising: a reference voltage generation circuit which generates a plurality of reference voltages; a plurality of comparators which are supplied with an analog input voltage and any two reference voltages out of the plurality of reference voltages and which are adjusted a threshold voltage according to the two reference voltages to compare the analog input voltage with the threshold voltage; and an encoder circuit which is supplied with a plurality of comparison output signals of the plurality of comparators and which outputs digital signals corresponding to the plurality of comparison output signals.

DETAILED DESCRIPTION OF THE INVENTION

Figure 1:
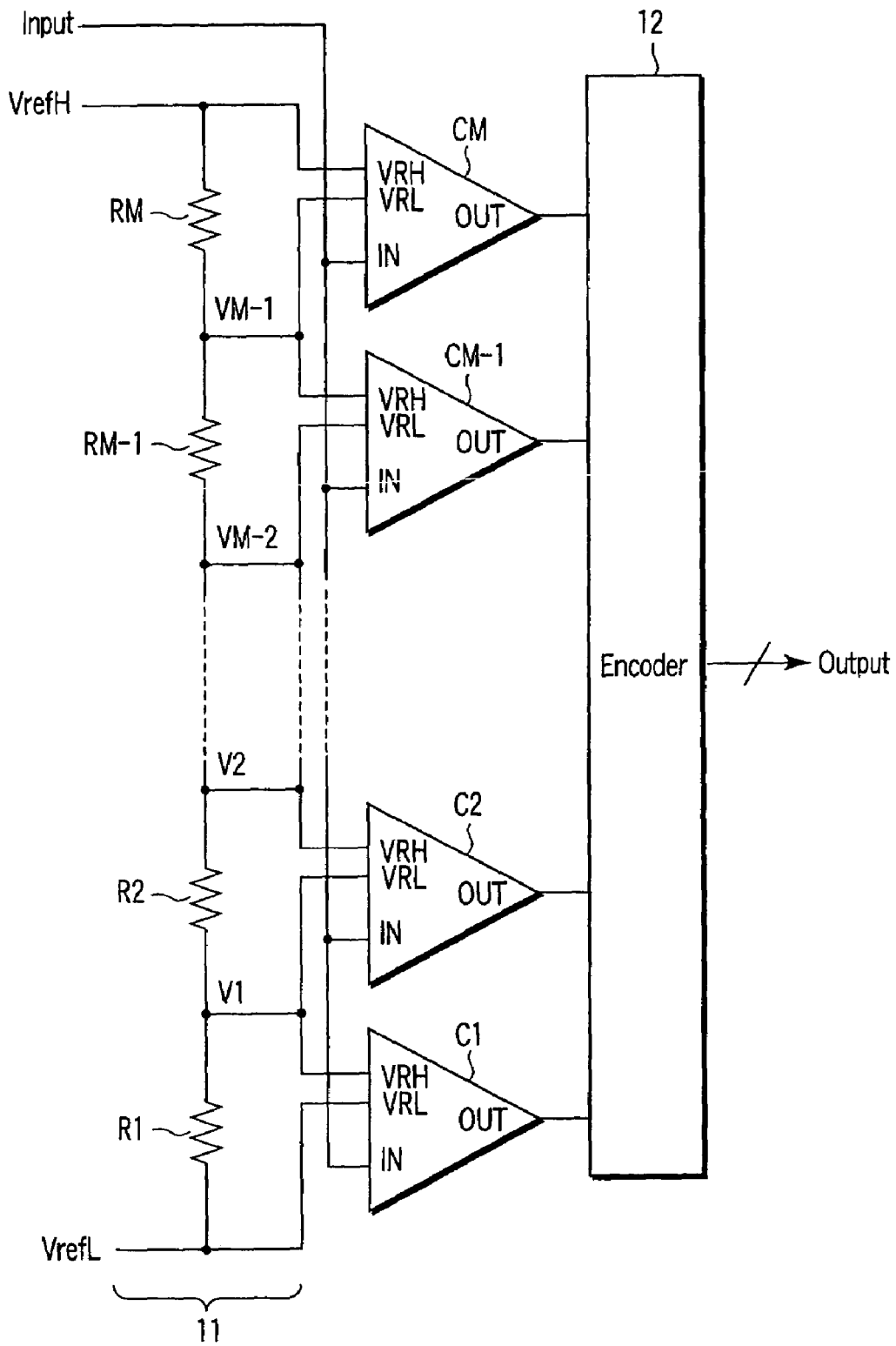
FIG. 1 is a circuit diagram showing an analog to digital conversion circuit according to a first embodiment of the present invention.

Hereinafter, embodiments of the present invention will be explained with reference to the accompanying drawings. Incidentally, common portions in all the drawings are denoted with common reference numerals in the explanation.

FIRST EMBODIMENT

An analog to digital conversion circuit (A/D converter) shown in FIG. 1 has a resolution of N (a positive integer number) bits, and comprises a reference voltage generation circuit 11, M ($=2^N-1$) comparators C1 to CM, and an encoder 12. The A/D converter is formed on a chip of a semiconductor integrated circuit, and the converter has a calibration mode (first mode) for calibrating properties to convert an analog signal to a digital signal, and a normal operation mode (second mode) for converting an analog signal to a digital signal. In the first mode, threshold voltages of the M comparators C1 to CM are adjusted.

The reference voltage generation circuit 11 comprises M resistors R1 to RM which are connected in series between supply terminals of two reference voltages VrefH and VrefL. The reference voltage VrefH is larger than the reference voltage VrefL. The reference voltage generation circuit 11 generates a plurality of reference voltages V1 to VM-1 by dividing the voltage between the supply terminals of the two reference voltages VrefH and VrefL. The two reference voltages VrefH and VrefL themselves constitute a part of the reference voltage.

The comparators C1 to CM each incorporate a circuit for correcting a direct current offset voltage of the threshold voltage by using any two reference voltages out of the plurality of reference voltages. The comparators C1 to CM each includes an analog signal input terminal IN, two reference voltage input terminals VRH and VRL, and an output terminal OUT. The plurality of comparators C1 to CM compare in a lump the analog input voltage with respective threshold voltages.

An analog input voltage is applied to each of these comparators C1 to CM. Two different reference voltages are applied to each comparator, too. The two different reference voltages are selected from reference voltages VrefL and VrefH and reference voltages V1 to VM-1, which differ in value. More precisely, reference voltages VrefL and V1 are applied to the reference voltage input terminals VRL and VRH of the comparator C1, respectively, reference voltages V1 and V2 are applied to the reference voltage input terminals VRL and VRH of the comparator C2, reference voltages V2 and V3 are applied to the reference voltage input terminals VRL and VRH of the comparator C3, and so forth. Thus, reference voltages MV-1 and VrefH are applied to the reference voltage input terminals VRL and VRH of the comparator CM.

It is constituted in such a manner that the threshold voltage of each of the comparators C1 to CM can be set to a voltage equivalently divided in accordance with a value of the control signal within the range of two reference voltages whose values are mutually adjacent to each other among the plurality of reference voltages V1 to VM-1, VrefH and VrefL. In this case, if the offset voltage is not set to zero, the threshold voltage can be shifted in a direction of eliminating the offset voltage. That is, when the offset voltage is within the range of the two reference voltages, the offset voltage can be corrected so as to reduce the offset of the comparators C1 to CM.

In this manner, in the A/D converter according to the first embodiment, the direct current offset voltage of the threshold voltage of the plurality of comparators C1 to CM can be corrected with a simple circuit configuration, and an attempt can be made to improve the conversion properties.

Next, there will be explained a concrete circuit configuration of the comparators C1 to CM in FIG. 1.

Figure 2:
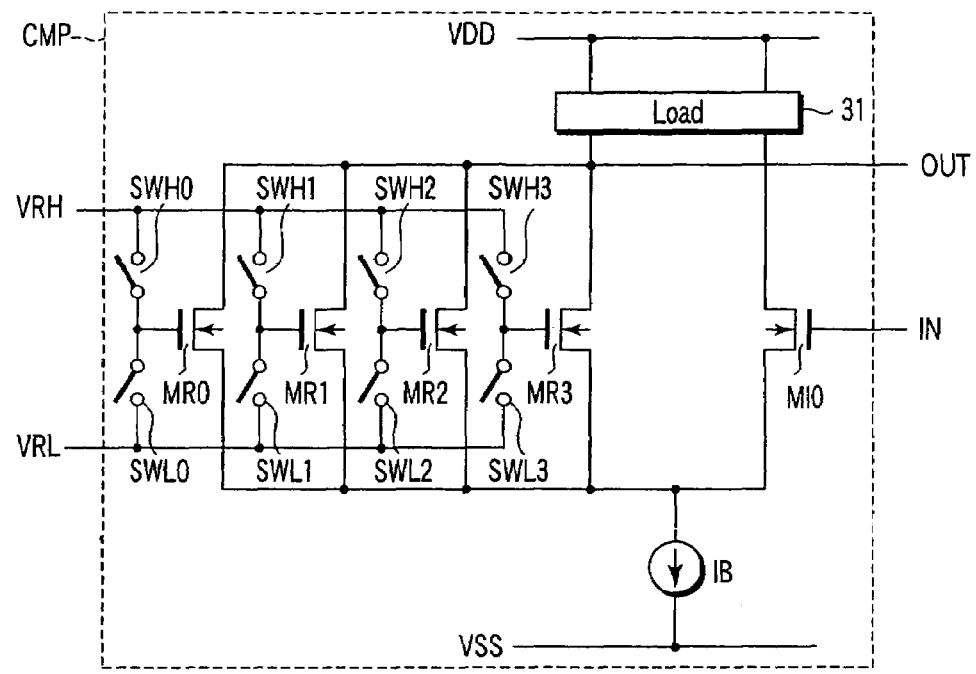
FIG. 2 is a circuit diagram showing one example of a comparator which is used in the analog to digital conversion circuit of FIG. 1.

FIG. 2 is a view showing one concrete example of the comparators C1 to CM. The comparator CMP has an N-channel type MOS transistor (NMOS transistor) MIO which constitutes a signal input element, and four NMOS transistors MR0 to MR3 which constitute reference voltage input elements. A gate electrode (control terminal) of the NMOS transistor MIO is connected to a signal input terminal IN. Gate electrodes (control terminals) of the four NMOS transistors MR0 to MR3 are connected to a reference voltage input terminal VRH via switching elements SWH0 to SWH3, and also are connected to a reference voltage input terminal VRL via switching elements SWL0 to SWL3. Sources of the NMOS transistors MIO and MR0 to MR3 are commonly connected. A constant current source IB is connected between a source common connection node of the NMOS transistors MIO and MR0 to MR3 and a supply terminal of a ground potential (VSS).

Drains of the NMOS transistors MR0 to MR3 are commonly connected, and a drain common connection node of the NMOS transistors MR0 to MR3 is connected to a load circuit (load) 31 together with a drain of the NMOS transistor MIO. The load circuit 31 is connected to a supply terminal of a power source voltage (VDD). The load circuit 31 includes, for example, a current mirror circuit or a pair of resistor elements. Then, for example, the drain common connection node of the NMOS transistors MR0 to MR3 constitutes an output node of a comparison signal OUT.

That is, the NMOS transistors MIO and the NMOS transistors MR0 to MR3 constitute a differential pair. In this embodiment, the NMOS transistor which constitutes a differential pair with the NMOS transistor MIO comprises four NMOS transistors MR0 to MR3. The number of NMOS transistors may be any as required.

The switching elements SWH0 to SWH3 and SWL0 to SWL3 in FIG. 2 are controlled in such a manner that the gate electrodes of the NMOS transistors MR0 to MR3 are connected to any of the reference voltage input terminals VRH and VRL. Concrete circuit examples of each of the switching elements are shown in FIGS. 3 to 5.

Figure 3:
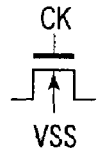
FIG. 3 is a circuit diagram showing a concrete example of a switching element in the comparator of FIG. 2.

The switching element shown in FIG. 3 is composed of an NMOS transistor. A control signal CK is supplied to a gate electrode of the NMOS transistor. The switching element shown in FIG. 4 is composed of a PMOS transistor. A control signal CKB (CKB is a signal which has a phase reverse to CK) is supplied to a gate electrode of the PMOS transistor. The switching element shown in FIG. 5 is composed of an NMOS transistor and a PMOS transistor whose drains and sources are connected in parallel to each other. A control signal CK is supplied to a gate electrode of the NMOS transistor while a control signal CKB is supplied to a gate electrode of the PMOS transistor.

Figure 4:
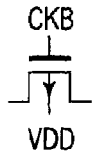
FIG. 4 is a circuit diagram showing another concrete example of the switching element in the comparator of FIG. 2.
Figure 5:
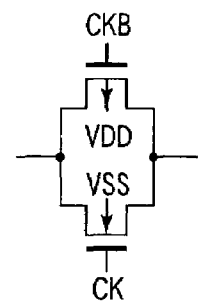
FIG. 5 is a circuit diagram showing still another concrete example of the switching element in the comparator of FIG. 2.

Incidentally, the switching elements SWH0 to SWH3 and SWL0 to SWL3 are not limited to the circuit examples shown in FIGS. 3 to 5. An element can be used which can function as a switching element, and an element or a structure can be used which has a function of sufficiently blocking a current such as a fuse which can be cut by current or laser beam irradiation. In the case where a fuse which is cut with current or laser beam irradiation is used, the ON/OFF setting of the switching elements SWH0 to SWH3 and SWL0 to SWL3 may be made by performing trimming prior to the shipment of the A/D converter.

The NMOS transistors MIO and MR0 to MR3 are designed in the following manner. The channel lengths of the NMOS transistors MIO and MR0 to MR3 are made equal to each other. Furthermore, if the channel width of the NMOS transistor MIO is 15, each of the NMOS transistors MR0 to MR3 is weighted by power two with respect to the immediately preceding NMOS transistor. That is, the channel width of the NMOS transistor MR0 is 1, the channel width of the NMOS transistor MR1 is 2, the channel width of the NMOS transistor MR2 is 4, and the channel width of the NMOS transistor MR3 is 8. Furthermore, the sum total of the channel widths of the NMOS transistors MR0 to MR3 becomes equal to the channel width of the NMOS transistor MIO.

Figure 6:
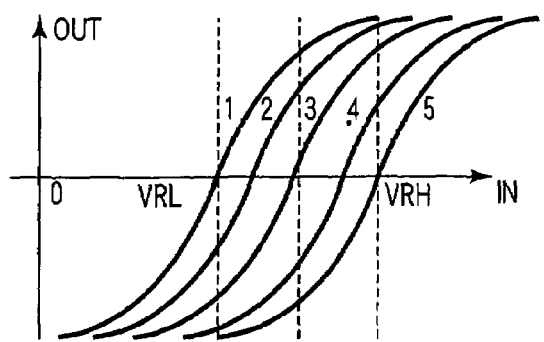
FIG. 6 is a view showing one example of the change properties of a threshold voltage of the comparator of FIG. 2.

When the NMOS transistors MR0 to MR3 are designed in the aforementioned manner, the threshold voltage of the comparator CMP changes at the time of switching over the switching elements SWH0 to SWH3 and SWL0 to SWL3. The change properties thereof are shown in the following Table 1, and the input and output properties of the comparator change as shown in FIG. 6. However, Table 1 shows a terminal to which the gate electrodes of the NMOS transistors MR0 to MR3 which are reference voltage input terminals are connected, instead of a method for switching over the switching elements SWH0 to SWH3 and SWL0 to SWL3. For example, when the NMOS transistor MR0 is noted, the case in which the gate electrode is connected to the reference voltage input terminal VRL means that the switching element SWL0 is turned on while the switching element SWH0 is turned off, and the case in which the gate electrode is connected to the reference voltage input terminal VRH means that the switching element SWL0 is turned off and the switching element SWH0 is turned on. The same thing holds true of the other NMOS transistors MR1 to MR3.

TABLE I

| Destinations connected to gates of reference voltage input elements | | | | Threshold voltage | Corresponding property |
|---|---|---|---|---|---|
| MR3 | MR2 | MR1 | MR0 | (approximate value) | (FIG. 6) |
| VRL | VRL | VRL | VRL | VRL | 1 |
| VRL | VRL | VRL | VRH | (VRH × 1 + VRL × 14)/15 | |
| VRL | VRL | VRH | VRL | (VRH × 2 + VRL × 13)/15 | |
| VRL | VRL | VRH | VRH | (VRH × 3 + VRL × 12)/15 | 2 |
| VRL | VRH | VRL | VRL | (VRH × 4 + VRL × 11)/15 | |
| VRL | VRH | VRL | VRH | (VRH × 5 + VRL × 10)/15 | |
| VRL | VRH | VRH | VRL | (VRH × 6 + VRL × 9)/15 | |
| VRL | VRH | VRH | VRH | (VRH × 7 + VRL × 8)/15 | 3 |
| VRH | VRL | VRL | VRL | (VRH × 8 + VRL × 7)/15 | |
| VRH | VRL | VRL | VRH | (VRH × 9 + VRL × 6)/15 | |
| VRH | VRL | VRH | VRL | (VRH × 10 + VRL × 5)/15 | |
| VRH | VRL | VRH | VRH | (VRH × 11 + VRL × 4)/15 | 4 |
| VRH | VRH | VRL | VRL | (VRH × 12 + VRL × 3)/15 | |
| VRH | VRH | VRL | VRH | (VRH × 13 + VRL × 2)/15 | |
| VRH | VRH | VRH | VRL | (VRH × 14 + VRL × 1)/15 | |
| VRH | VRH | VRH | VRH | VRH | 5 |

In this manner, when the switching elements SWH0 to SWH3 and SWL0 to SWL3 are appropriately switched over, the threshold voltage can be adjusted even if an offset occurs in the threshold voltage of the comparator CMP. The change properties are characterized in that the properties are generally determined with the ratio of the element size on the presupposition that the element properties per unit W/L (W denotes a channel width and L denotes a channel length) of the NMOS transistors MIO and MR0 to MR3 are equal. An influence on the variable properties is generally small even if the element properties themselves vary along with the change in the temperature and the bias condition.

Incidentally, the properties shown here are given merely as one example. In the case where different properties are required, the number of NMOS transistors which are reference voltage input elements may be arbitrarily changed, or the channel width of each element, the channel length thereof or the like may be designed, in order to obtain desired properties.

As has been described above, the characteristics of the present embodiment are such that only two reference voltages are required for adjusting the threshold voltage of the comparators C1 to CM to different values of three stages or more, and besides the change properties are determined with the ratio of the element size. Conventionally, it is required to prepare the same number of reference voltages as the number of steps of correcting the threshold voltage of the comparators C1 to CM. Furthermore, since the change properties of the threshold voltage largely depend on the element properties themselves, the present embodiment is largely different from the conventional method.

In the present embodiment, there are provided an advantage of decreasing the number of control signals as compared with the conventional one and an advantage of eliminating the need of a decoder circuit for the control signal. In particular, if the channel width of each element is weighted by power two, the advantage thereof is large. For example, in the case where a change width by four bits is provided, 16 control signals are conventionally required. Otherwise, in the case where the decoder circuit for the control signal is used, 4 control signals which lead to the decoder, the decoder circuit for converting from 4 bits to 16 bits, and 16 control signals which lead to a selector from the decoder circuit are required. What is noted here is that when the decoder circuit is used, conventionally only one decoder will not do in the entire A/D converter. One decoder circuit is required for one comparator. On the other hand, 4 control signals are sufficient in this embodiment while the decoder circuit for the control signal is not required.

Moreover, in this embodiment, there are provided advantages in that the number of resistor elements constituting the reference voltage generation circuit 11 can be decreased, and that the number of wirings for taking out taps can be decreased. Conventionally, it is required to divide one resistor elements into 16 parts to take out 16 taps in order to generate 16 step portions of reference voltages.

In the present embodiment, on the other hand, it is not required to divide the resistor element, and two taps may be taken out from both ends of respective resistor elements. An area of chips which occupies the resistor elements can be decreased more in the present embodiment than the conventional one. Conventionally, 1LSB portion of resistor elements is divided into a plurality of portions. In the case where the resistor element is divided, there are provided a method for dividing the resistor element in a longitudinal direction and a method for realizing the object by enlarging the width of the resistor element without changing the length of the resistor element to decrease the one resistor value. Since the length of the resistor element is already approximate to the minimum value of the design standard in the latter method, the method is performed when it is possible to divide the resistor element in a longitudinal direction. In the case where the resistor element is divided in a longitudinal direction, the area for purely realizing the resistor element is unchangeable. However, it is required to form a contact for taking out taps, and the area becomes either the same or larger. In the case where the resistor element is enlarged in a widthwise direction, the area of a single resistor element is enlarged, the chip area occupied by the resistor element is enlarged.

In the present embodiment, it is not required to divide the resistor element, so that the chip area occupied by the resistor element does not increase even if the resistor element assumes any structure. That is, in the present embodiment, there is provided an advantage in that the chip area occupied by the resistor element of the reference voltage generation circuit 11 can be decreased.

Figure 7:
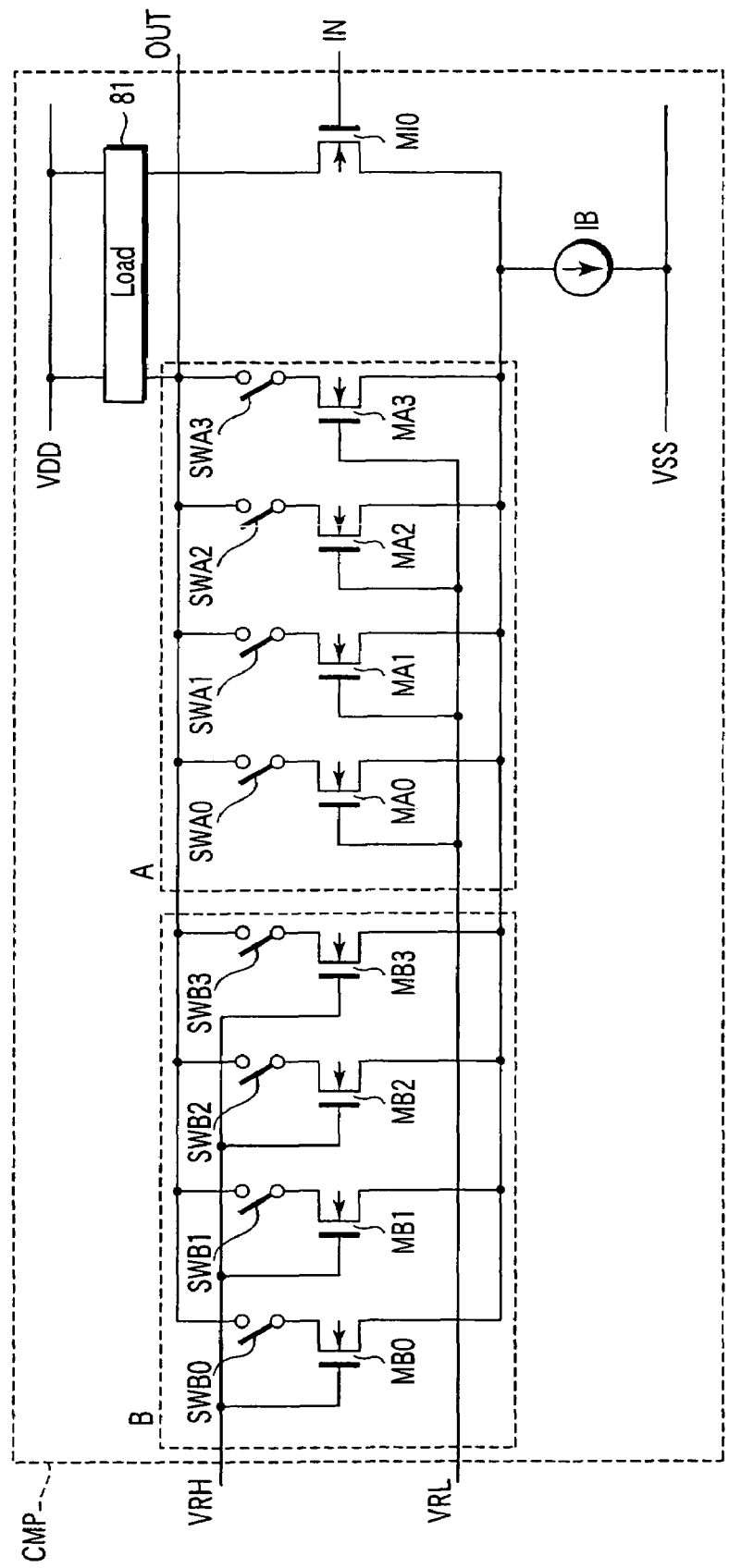
FIG. 7 is a circuit diagram showing another example of the comparator which is used in the analog to digital conversion circuit of FIG. 1.

FIG. 7 is a diagram showing another concrete example of the comparators C1 to CM. The function and the terminal provided on the comparator CMP are the same as those of the comparator shown in FIG. 2.

The comparator CMP shown in FIG. 7 has an NMOS transistor MIO which constitutes a signal input element and each four NMOS transistors MA0 to MA3 and MB0 to MB3 which constitute reference voltage input elements. Gate electrodes (control terminals) of the four NMOS transistors MB0 to MB3 are commonly connected to a reference voltage input terminal VRH, and gate electrodes (control terminals) of the four NMOS transistors MA0 to MA3 are commonly connected to a reference voltage input terminal VRL. A source (current output terminal) of the NMOS transistor MIO and sources (current output terminals) of the four NMOS transistors MA0 to MA3 and MB0 to MB3 are commonly connected. Then, a constant current source IB is connected between a source common connection node of the NMOS transistors MIO, MA0 to MA3 and MB0 to MB 3 and a supply terminal of a ground potential (VSS). One ends of switching elements SWB0 to SWB3 are respectively connected to drains of the four NMOS transistors MB0 to MB3 while the other ends of the switching elements SWB0 to SWB3 are commonly connected. One ends of switching elements SWA0 to SWA3 are respectively connected to drains of the other four NMOS transistors MA0 to MA3 while the other ends of the switching elements SWA0 to SWA3 are commonly connected. Furthermore, the other end common connection nodes of the switching elements SWB0 to SWB3 and SWA0 to SWA3 are connected, and the other end common connection nodes of the switching elements SWB0 to SWB3 and SWA0 to SWA3 are connected to a load circuit (load) 81. A drain of the NMOS transistor MIO is also connected to the load circuit 81. The load circuit 81 is connected to a supply terminal of a power source voltage (VDD). The load circuit 81 includes, for example, a current mirror circuit or a pair of resistor elements. Then, for example, the other end common connection node of the switching elements SWA0 to SWA3 and SWB0 to SWB3 constitutes an output node of a comparison signal OUT.

The switching elements SWA0 to SWA3 and SWB0 to SWB3 are controlled such that at least one of the switching elements SWA0 to SWA3 and SWB0 to SWB3 is turned on. Since a concrete example of the switching elements SWA0 to SWA3 and SWB0 to SWB3 is the same as the aforementioned circuit by referring to FIGS. 3 to 5, an explanation thereof is omitted. However, except for the circuit shown in FIGS. 3 to 5, any element or any structure which has a function of sufficiently blocking the current can be used.

The NMOS transistors MIO and MA0 to MA3 and MB0 to MB3 are designed in the following manner. Respective channel lengths of the NMOS transistors MIO and MA0 to MA3 and MB0 to MB3 are made equal to each other. Furthermore, if the channel width of the NMOS transistor MIO is 15, each of the NMOS transistors MA0 to MA3 and MB0 to MB3 is weighted by power two with respect to the immediately preceding NMOS transistor. That is, the channel widths of the NMOS transistors MA0 and MB0 are 1, the channel widths of the NMOS transistors MA1 and MA1 are 2, the channel widths of the NMOS transistors MA2 and MA2 are 4, and the channel widths of the NMOS transistors MA3 and MB3 are 8. Furthermore, the sum total of the channel widths of the NMOS transistors MA0 to MA3 and the sum total of the channel widths of the NMOS transistors MB0 to MB3 are made respectively equal to the channel width of the NMOS transistor MIO.

When the embodiment is designed in the aforementioned manner, the threshold voltage of the comparator CMP changes at the time of switching over the switching elements SWA0 to SWA3 and SWB0 to SWB3, and the change properties thereof will be given as shown in Table 2. However, in Table 2, there is shown the sum total of the channel widths of transistors (active elements) in which the drain side is not blocked among the NMOS transistors MA0 to MA3 and MB0 to MB 3, instead of the method for switching over the switching elements SWA0 to SWA3 and MB0 to MB3. For example, in the case where the sum total of the channel widths of transistors having drains connected to the load circuit 81 on the side of the NMOS transistors MA0 to MA3 (element group A) is set to 3 while the sum total of the channel widths of transistors having drains connected to the load circuit 81 on the side of the NMOS transistors MB0 to MB3 (element group B) is set to 12, the switching elements SWA0 to SWA1 are turned on, the switching elements SWA2 and SWA3 are turned off, the switching elements SWB2 and SWB3 are turned on, and the switching elements SWB0 to SWB1 are turned off.

The switching elements SWB0 to SWB3 are connected between the drains of four NMOS transistors MB0 to MB3 and the load circuit 81, respectively, and the switching elements SWA0 to SWA3 are connected between the drains of four NMOS transistors MA0 to MA3 and the load circuit 81, respectively. Instead, the switching elements SWB0 to SWB3 may be connected between the sources of the NMOS transistors MB0 to MB3 and the constant current source IB, respectively, and the switching elements SWA0 to SWA3 are connected between the sources of the NMOS transistors MA0 to MA3 and the constant current source IB, respectively. Alternatively, eight switching elements may be connected to the drain and sources of the NMOS transistors MB0 to MB3, respectively, and eight switching elements may be connected to the drain and sources of the NMOS transistors MA0 to MA3, respectively.

TABLE 2

| Sum total of channel widths of active elements | | Threshold voltage (approximate value) | Corresponding property (FIG. 6) |
|---|---|---|---|
| Element group A | Element group B | | |
| 15 | 0 | VRL | 1 |
| 14 | 1 | (VRH × 1 + VRL × 14)/15 | |
| 13 | 2 | (VRH × 2 + VRL × 13)/15 | |
| 12 | 3 | (VRH × 3 + VRL × 12)/15 | 2 |
| 11 | 4 | (VRH × 4 + VRL × 11)/15 | |
| 10 | 5 | (VRH × 5 + VRL × 10)/15 | |
| 9 | 6 | (VRH × 6 + VRL × 9)/15 | |
| 8 | 7 | (VRH × 7 + VRL × 8)/15 | 3 |
| 7 | 8 | (VRH × 8 + VRL × 7)/15 | |
| 6 | 9 | (VRH × 9 + VRL × 6)/15 | |
| 5 | 10 | (VRH × 10 + VRL × 5)/15 | |
| 4 | 11 | (VRH × 11 + VRL × 4)/15 | 4 |
| 3 | 12 | (VRH × 12 + VRL × 3)/15 | |
| 2 | 13 | (VRH × 13 + VRL × 2)/15 | |
| 1 | 14 | (VRH × 14 + VRL × 1)/15 | 5 |
| 0 | 15 | VRH | |

In this manner, when the switching elements SWA0 to SWA3 and SWB0 to SWB3 are appropriately switched over, the threshold voltage can be adjusted even when an offset occurs in the threshold voltage of the comparators C1 to CM. The change properties of the threshold voltage are such that the threshold voltage is generally determined with the ratio of the element size on the presupposition that the element properties per unit W/L of the NMOS transistors MIO and MA0 to MA3 and MB0 to MB3 are equal. Even when the element properties themselves change along with the change in the temperature and the bias condition, the influence upon these variable properties is generally small.

Incidentally, the properties shown here is merely one example. In the case where the properties different from these properties are required, the number of NMOS transistors which are reference voltage input elements is arbitrarily changed, or the channel width and the channel length of each element may be designed such that desired properties can be obtained.

As has been described above, even when the comparator shown in FIG. 7 is used, the same properties can be obtained as in the case where the comparator shown in FIG. 2 is used. As a consequence, a detailed explanation thereof will be omitted.

In FIG. 7, there is shown an example in which the switching elements SWA0 to SWA3 and SWB0 to SWB3 are inserted to the drain side of the NMOS transistors MA0 to MA3 and MB0 to MB3. However, the connection between the switching elements SWA0 to SWA3 and SWB0 to SWB3 may be changed on condition that a current between the drain and the source of the switching elements SWA0 to SWA3 and MB0 to MB3 can be blocked. For example, the switching elements SWA0 to SWA3 and SWB0 to SWB3 may be inserted to the side of the source of the NMOS transistors MA0 to MA3 and MB0 to MB3.

When the comparators C1 to CM which are used in the A/D converter shown in FIG. 1 are not limited to the comparators shown in FIG. 2 or FIG. 7 and can be modified in various manners as long as the comparators have a function of responding to a differential input signal. Hereinafter, a plurality of modified examples thereof will be explained. Incidentally, the comparators explained hereinbelow relate to a modified example of the comparator shown in FIG. 2. However, the comparator shown in FIG. 7 can be varied in the same manner.

With respect to the comparator shown in FIG. 2, there is shown an example in which the output signal OUT is taken out from the drain side of the NMOS transistors MR0 to MR3 which are reference voltage input elements. However, the output may be taken out from the drain side of the NMOS transistor MIO which is a signal input element, or the output may be taken out from both drain sides as a differential signal.

Figure 8:
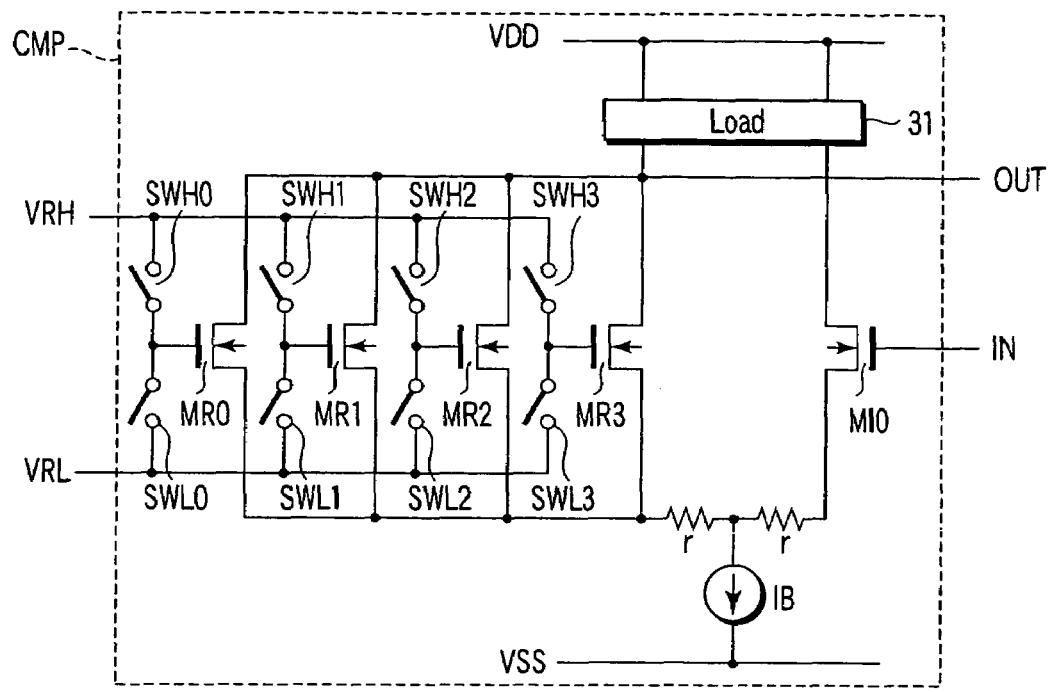
FIG. 8 is a circuit diagram showing a second modified example of the comparator of FIG. 2.

FIG. 8 is a diagram showing a second modified example of the comparator shown in FIG. 2. The comparator shown in FIG. 8 is different from the comparator shown in FIG. 2 in that a resistor element or an element r having resistive properties which includes a MOS transistor that operates in, for example, a linear region is connected between a source of an NMOS transistor MIO and a constant current source IB, and between a source common connection node of NMOS transistors MR0 to MR3 and the constant current source IB. The comparator shown in FIG. 7 can be modified in the same manner as described above.

Figure 9:
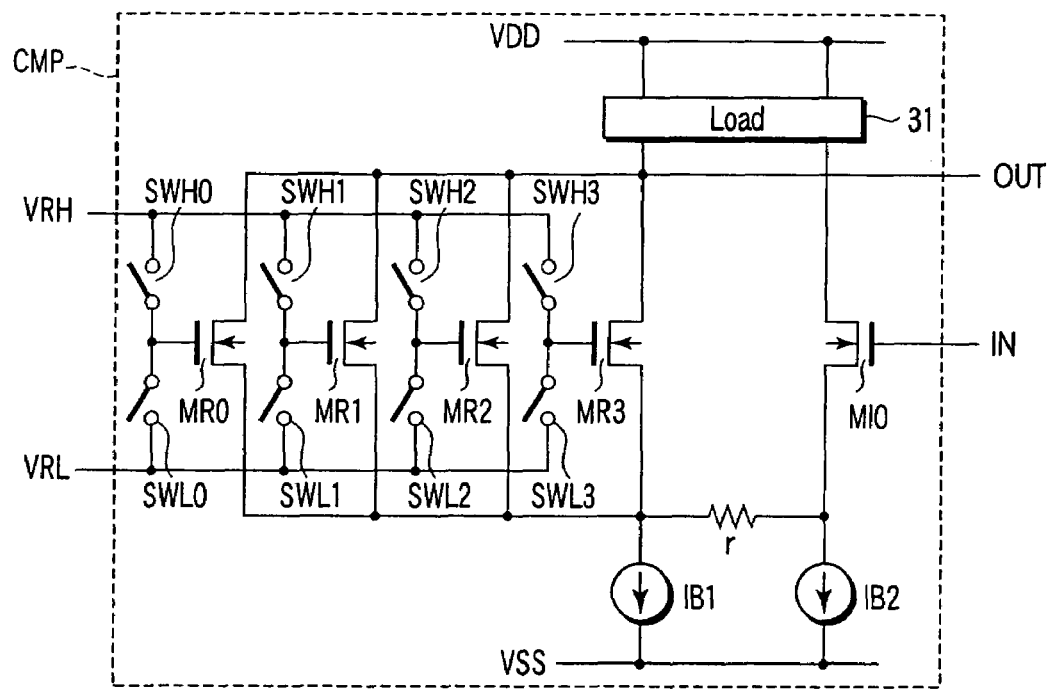
FIG. 9 is a circuit diagram showing a third modified example of the comparator of FIG. 2.

FIG. 9 is a diagram showing a third modified example of the comparator shown in FIG. 2. The comparator shown in FIG. 9 is different from the comparator shown in FIG. 2 in that a constant current source IB is divided into a plurality of sources, that is, the constant current source IB is divided into two constant current sources IB1 and IB2 in this embodiment, and that a resistor element or an element r having resistive properties is inserted between the two divided constant current source IB1 and IB2. The comparator shown in FIG. 7 can be modified in the same manner as described above.

Figure 10:
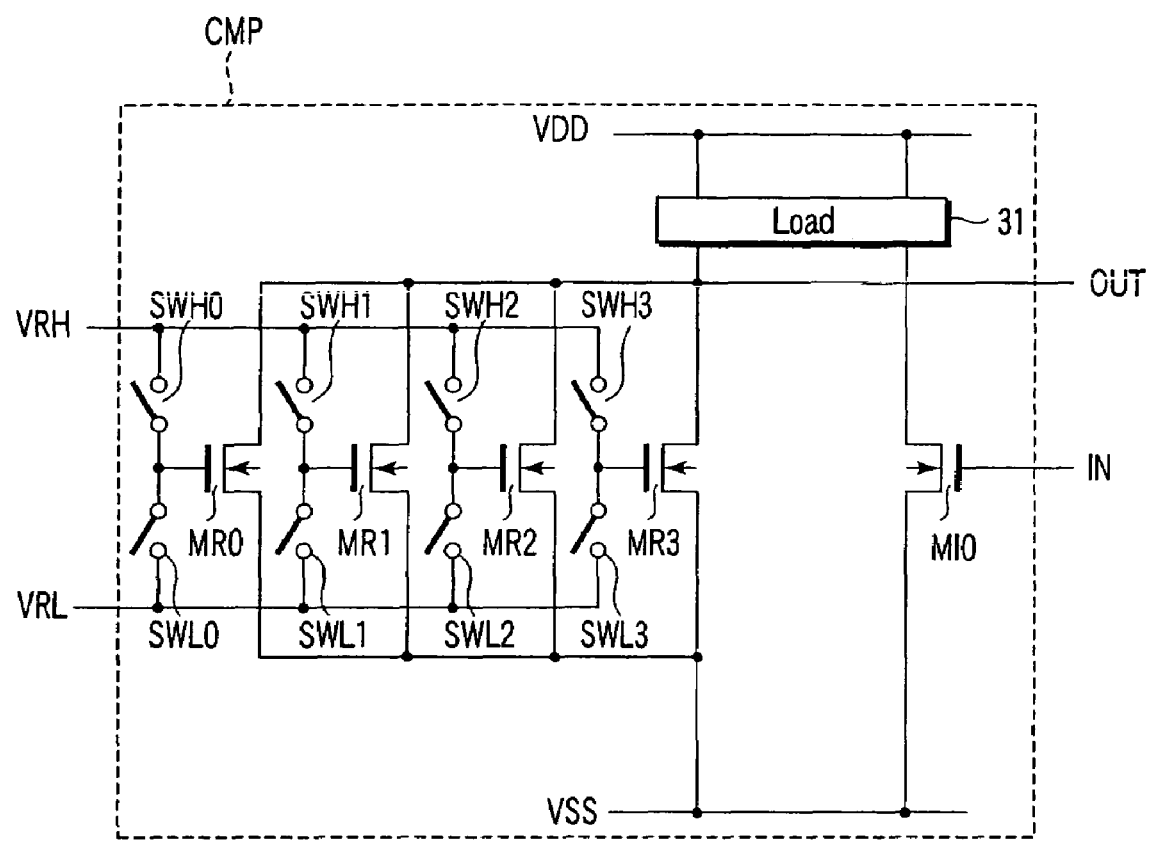
FIG. 10 is a circuit diagram showing a fourth modified example of the comparator of FIG. 2.

FIG. 10 is a diagram showing a fourth modified example of the comparator shown in FIG. 2. The comparator shown in FIG. 10 is different from the comparator shown in FIG. 2 in that a constant current source IB is omitted, and that a source of an NMOS transistor MIO and a source common connection node of NMOS transistors MR0 to MR3 are connected to a supply terminal of a ground potential VSS. Incidentally, a resistor element or an element having resistive properties may be interposed between the source of the NMOS transistor MIO and the source common connection node of the NMOS transistors MR0 to MR3. The comparator shown in FIG. 7 can be modified in the same manner as described above. However, in the case where one signal is output as seen in the comparator shown in FIG. 2 or FIG. 7, it is required to use a configuration in which both an output signal of the signal input element and an output signal of the reference voltage input signal generally affect the output, that is, it is required to use a current mirror circuit as a load circuit. In contrast, in the case where a differential signal is output from the comparator, the configuration may be such that the circuit on the latter stage can be operated upon receipt of the differential input signal.

In the comparator shown in FIG. 2 or FIG. 7 and the modified examples thereof, the configuration may be such that the NMOS transistors are replaced with PMOS transistors, and the VDD terminal and the VSS terminal are replaced with each other.

SECOND EMBODIMENT

Figure 11:
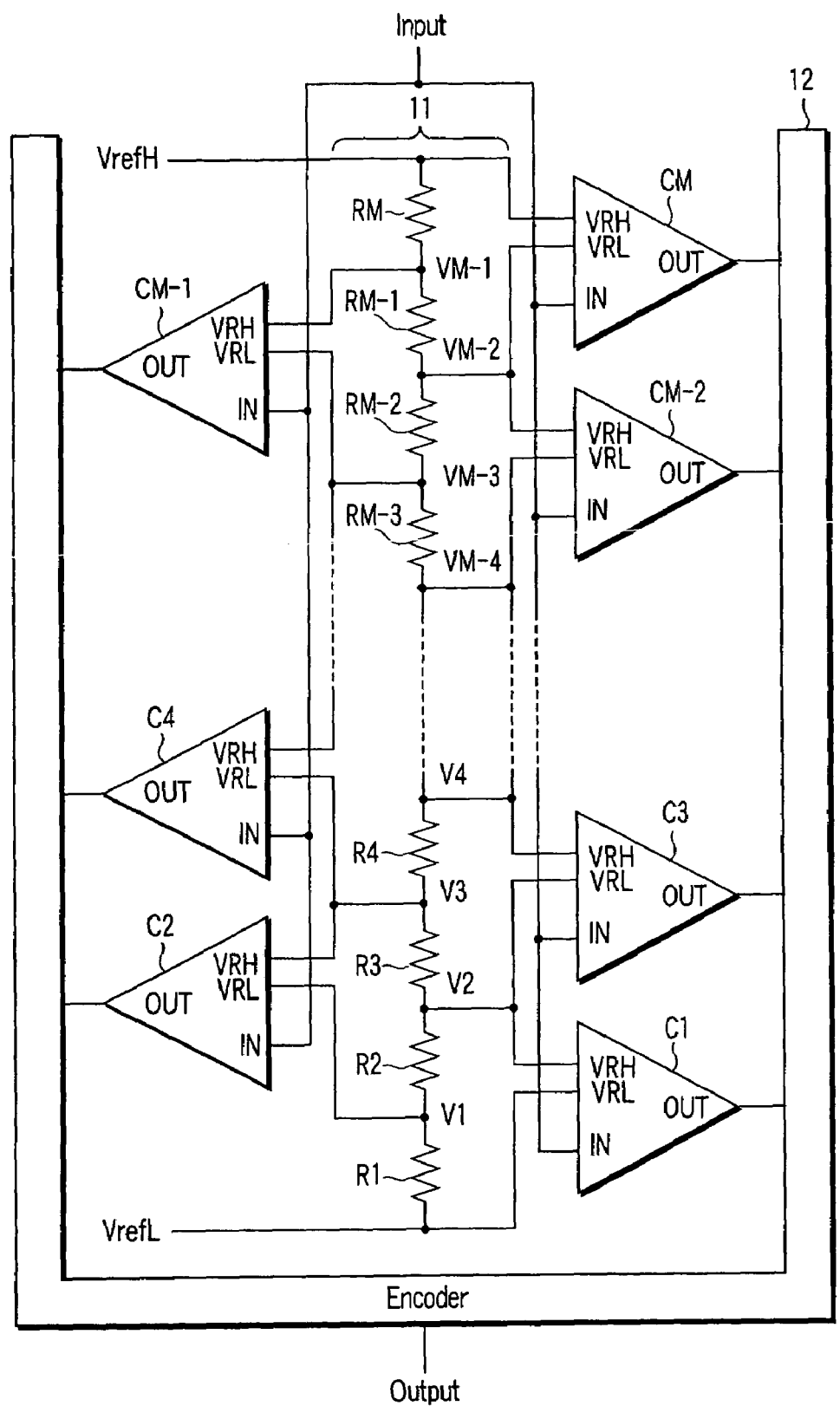
FIG. 11 is a circuit diagram of an analog to digital conversion circuit according to a second embodiment of the present invention.

FIG. 11 is a diagram showing an analog to digital conversion circuit (A/D converter) according to a second embodiment of the invention. The A/D converter has, in the same manner as in the first embodiment, N bits of resolution number, and the A/D converter includes a reference voltage generation circuit 11, M ($=2^N-1$) comparators C1 to CM, and an encoder circuit 12. The M comparators C1 to CM have the same configuration as any of the comparators shown in FIGS. 2 and 7, and modified examples thereof. The A/D converter is different from the A/D converter shown in FIG. 1 in respective two reference voltages which are supplied to the M comparators C1 to CM. That is, in the A/D converter according to the first embodiment, two reference voltages whose values are adjacent to each other are supplied to the comparators C1 to CM. In the second embodiment, on the other hand, two reference voltages whose values are not adjacent to each other, that is, one reference voltage and a subsequent reference voltage which skips a reference voltage having a value adjacent to the value of the one reference voltage are supplied to each of the comparators, as shown in, for example, FIG. 11. In other words, each of the comparators C1 to CM is supplied with two voltages (voltage for every two taps) which are not adjacent to each other out of one end, the other end of a resistor string of the reference voltage generation circuit 11, the resistor string including a plurality of resistor elements, and a plurality of taps (connection nodes of resistor elements).

The characteristics of the A/D converter according to the second embodiment lie in that the adjustment range of the offset of the threshold voltage of the comparators C1 to CM is wider than the adjustment range of the A/D converter according to the first embodiment.

Incidentally, with respect to the connection between the reference voltage generation circuit and a plurality of comparators, there are shown two methods according to the first and second embodiments. However, the connection method is not limited thereto, and any tap may be connected to comparators in accordance with the desired properties.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An analog to digital conversion circuit comprising:
a reference voltage generation circuit which generates a plurality of reference voltages;
a plurality of comparators which is supplied with an analog input voltage and any two reference voltages out of said plurality of reference voltages, said plurality of comparators adjusting a threshold voltage equivalently to a value in between the two reference voltages in accordance with the two reference voltages, and comparing the analog input voltage with the threshold voltage; and
an encoder circuit which is connected to said plurality of comparators and which is supplied with a plurality of comparison output signals of said plurality of comparators and which outputs digital signals corresponding to said plurality of comparison output signals.

2. The analog to digital conversion circuit according to claim 1, wherein the reference voltage generation circuit includes a plurality of voltage dividing elements connected in series between a supply terminal of a first reference voltage and a supply terminal of a second reference voltage, the first reference voltage, the second reference voltage, and a plurality of divided voltages generated on respective series connection nodes of said plurality of divided voltage elements are generated as said plurality of reference voltages.

3. The analog to digital conversion circuit according to claim 1, wherein the two reference voltages which are supplied to each of said plurality of comparators are two reference voltages whose values are adjacent to each other out of said plurality of reference voltages.

4. The analog to digital conversion circuit according to claim 1, wherein the two reference voltages which are supplied to said plurality of comparators are two reference voltages whose values are not adjacent to each other out of said plurality of reference voltages.

5. The analog to digital conversion circuit according to claim 1, wherein each of said plurality of comparators includes:
a plurality of reference voltage input elements which is supplied with the two reference voltages and which is adjusted the threshold voltage for comparison;
a voltage input element which is connected to said plurality of reference voltage input elements, the voltage input element constituting a differential pair with said plurality of reference voltage input elements and being supplied with the analog input voltage; and
a load circuit which is connected to said plurality of reference voltage input elements and the voltage input element.

6. The analog to digital conversion circuit according to claim 1, wherein each of said plurality of comparators includes:
a plurality of reference voltage input elements each of which has one end, the other end and a control terminal, respective one ends thereof being commonly connected to each other, and the respective other ends thereof being commonly connected to each other;
a plurality of first switching elements which is connected between each of the control terminals of said plurality of reference voltage input elements and a supply terminal of one of the two reference voltages;
a plurality of second switching elements which is connected between each of the control terminals of said plurality of reference voltage input terminals and a supply terminal of the other reference voltage of the two reference voltages;
a voltage input element which has one end, the other end and a control terminal, the one end being coupled to a common connection node of the one ends of said plurality of reference voltage input terminals, and the control terminal being supplied with the analog input voltage; and
a load circuit which is connected to a supply terminal of a first power source voltage, a common connection node of the other ends of said plurality of reference voltage input elements and the other end of the voltage input element.

7. The analog to digital conversion circuit according to claim 6, wherein the one ends of said plurality of reference voltage input elements and one end of the voltage input element are commonly connected to each other.

8. The analog to digital conversion circuit according to claim 7, wherein each of said plurality of comparators further includes a current source connected between a supply terminal of a second power source voltage and a common connection node of the one ends of said plurality of reference voltage input elements and one end of the voltage input element.

9. The analog to digital conversion circuit according to claim 6, wherein each of said plurality of comparators further includes:
a first resistor element which has one end and the other end, the one end being connected to a common connection node of the one ends of said plurality of reference voltage input elements;
a second resistor element which has one end and the other end, the one end being connected to the one end of the voltage input element, and the other end being commonly connected to the other end of the first resistor element; and
a current source connected between a common connection node of the other ends of the first and second resistor elements and a supply terminal of a second power source voltage.

10. The analog to digital conversion circuit according to claim 6, wherein each of said plurality of comparators further includes:
a resistor element which has one end and the other end, the one end being connected to a common connection node of the one ends of said plurality of reference voltage input elements, and the other end being connected to one end of the voltage input element;
a first current source connected between one end of the resistor element and a supply terminal of a second power source voltage; and
a second current source connected between the other end of the resistor element and the supply terminal of the second power source voltage.

11. The analog to digital conversion according to claim 6, wherein said plurality of reference voltage input elements is respectively first MOS transistors,
the voltage input element is a second MOS transistor which has the same polarity as the first MOS transistor, and
each of the first MOS transistor and the second MOS transistor respectively have the same channel length, said plurality of first MOS transistors respectively have different channel widths while said plurality of first MOS transistors has a channel width which is weighted by power two, and the sum total of the channel widths of said plurality of first MOS transistors is equal to the channel width of the second MOS transistor.

12. The analog to digital conversion circuit according to claim 1, wherein each of said plurality of comparators further includes:
a plurality of first reference voltage input elements each of which has one end, the other end and a control terminal, respective one ends thereof being commonly connected to each other, and respective control terminals thereof being commonly connected to a supply terminal of one of the two reference voltage input terminals;
a plurality of first switching element each of which has one end and the other end, respective one ends thereof being connected to the other ends of said plurality of first reference voltage input elements, and the respective other ends being commonly connected to each other;
a plurality of second reference voltage input elements each of which has one end, the other end and a control terminal, the respective one ends being commonly connected to each other while being coupled to a common connection node of the one ends of said plurality of first reference voltage input elements, and respective control terminals thereof being commonly connected to a supply terminal of the other reference voltage of the two reference voltages;
a plurality of second switching elements each of which has one end and the other end, respective one ends thereof being connected to the respective other ends of said plurality of second reference voltage input elements, and the respective other ends being commonly connected to each other while being connected to a common connection node of the other ends of said plurality of the first switching elements;
a voltage input element which has one end, the other end and a control terminal, the one end being coupled to a common connection node of the one ends of said plurality of first reference voltage input elements and said plurality of second reference voltage input elements, and the control terminal being supplied with the analog input voltage; and
a load circuit connected to a supply terminal of a first power source voltage, a common connection node of the respective other ends of said plurality of first switching elements and said plurality of second switching elements, and the other end of the voltage input element.

13. The analog to digital conversion circuit according to claim 12, wherein each of said plurality of comparators further includes a current source connected between a supply terminal of a second power source voltage and a common connection node of the respective one ends of said plurality of first reference voltage input elements, said plurality of second reference voltage input elements and the voltage input element.

14. The analog to digital conversion circuit according to claim 12, wherein said plurality of first reference voltage input elements is respectively first MOS transistors,
said plurality of second reference voltage input elements is respectively second MOS transistors which have the same polarity as the first MOS transistors,
the voltage input element is a third MOS transistor which has the same polarity as the first and second MOS transistors, and
each of the first MOS transistors, each of the second MOS transistors and the third MOS transistor respectively have an equal channel length,
said plurality of first MOS transistors respectively has different channel widths while said plurality of first MOS transistors has a channel width which is weighted by power two, and the sum total of the channel widths of said plurality of first MOS transistors is equal to the channel width of the third MOS transistor; and
said plurality of second MOS transistors respectively has different channel widths while said plurality of second MOS transistors respectively has a channel width which is weighted by power two, and the sum total of the channel widths of said plurality of second MOS transistors is equal to the channel width of the channel width of the third MOS transistor.

15. The analog to digital conversion circuit according to claim 12, wherein each of said plurality of comparators further includes:

a first resistor element which has one end and the other end, the one end being connected to a common connection node of the one ends of said plurality of the first and second reference voltage input elements;

a second resistor element which has one end and the other end, the one end being connected to the one end of the voltage input element, and the other end being commonly connected to the other end of the first resistor element; and a current source connected between a common connection node of the other ends of the first and second resistor elements and a supply terminal of a second power source voltage.

16. The analog to digital conversion circuit according to claim 12, wherein each of said plurality of comparators further includes:

a resistor element which has one end and the other end, the one end being connected to a common connection node of the one ends of said plurality of me first and second reference voltage input elements, and the other end being connected to one end of the voltage input element;

a first current source connected between one end of the resistor element and a supply terminal of a second power source voltage; and a second current source connected between the other end of the resistor element and the supply terminal of the second power source voltage.

17. The analog to digital conversion circuit according to claim 1, wherein each of said plurality of comparators further includes:

a plurality of first reference voltage input elements each of which has one end, the other end and a control terminal, respective one ends thereof being commonly connected to each other, and respective control terminals thereof being commonly connected to a supply terminal of one of the two reference voltage input terminals;

a plurality of first switching element each of which has one end and the other end, respective one ends thereof being connected to the other ends of said plurality of first reference voltage input elements, and the respective other ends being commonly connected to each other;

a plurality of second reference voltage input elements each of which has one end, the other end and a control terminal, the respective one ends being commonly connected to each other while being coupled to a common connection node of the one ends of said plurality of first reference voltage input elements, and respective control terminals thereof being commonly connected to a supply terminal of the other reference voltage of the two reference voltages;

a plurality of second switching elements each of which has one end and the other end, respective one ends thereof being connected to the respective other ends of said plurality of second reference voltage input elements, and the respective other ends being commonly connected to each other while being connected to a common connection node of the other ends of said plurality of the first switching elements;

a voltage input element which has one end, the other end And a control terminal, the one end being coupled to a common connection node of the other ends of said plurality of first switching elements and said plurality of second switching elements, and the control terminal being supplied with the analog input voltage; and a load circuit connected to a supply terminal of a first power source voltage, a common connection node of the respective other ends of said plurality of first reference voltage input elements and said plurality of second reference voltage input elements, and the other end of the voltage input element.

18. The analog to digital conversion circuit according to claim 1, wherein each of said plurality of comparators further includes:

a plurality of first reference voltage input elements each of which has one end, the other end and a control terminal, and respective control terminals thereof being commonly connected to a supply terminal of one of the two reference voltage input terminals;

a plurality of first switching element each of which has one end and the other end, respective one ends thereof being connected to the one ends of said plurality of first reference voltage input elements;

a plurality of second switching elements each of which has one end and the other end respective one ends thereof being connected to the other ends of said plurality of first reference voltage input elements;

a plurality of second reference voltage input elements each of which has one end the other end and a control terminal, and respective control terminals thereof being commonly connected to a supply terminal of the other reference voltage of the two reference voltages;

a plurality of third switching elements each of which has one end and the other end, respective one ends thereof being connected to the one ends of said plurality of first reference voltage input elements, the respective the other ends being commonly connected to each other while being connected a common connection node of the other ends of said plurality of first switching elements;

a plurality of fourth switching elements each of which has one end and the other end, respective one ends thereof being connected to the respective other ends of said plurality of second reference voltage input elements, and the respective other ends being commonly connected to each other while being connected to a common connection node of the other ends of said plurality of the second switching elements;

a voltage input element which has one end, the other end and a control terminal, the one end being coupled to a common connection node of the other ends of said plurality of first switching elements and the other ends of said plurality of fourth switching elements, and the control terminal being supplied with the analog input voltage; and a load circuit connected to a supply terminal of a first power source voltage, a common connection node of the respective other ends of said plurality of first switching elements and said plurality of third switching elements, and the other end of the voltage input element.

19. An analog to digital conversion circuit comprising:

a reference voltage generation circuit which generates a plurality of reference voltages;

a plurality of comparators which is respectively supplied with an analog input voltage and any two reference voltages out of said plurality of reference voltages, said plurality of comparators adjusting a threshold voltage for comparison equivalently to a value in between the two reference voltages using the two reference voltages in a first mode, and comparing the analog input voltage with the threshold voltage in a second mode; and an encoder circuit which is connected to said plurality of comparators and which is supplied with a plurality of comparison output signals of said plurality of comparators and which outputs a digital signal in accordance with said plurality of comparison output signals.

20. The analog to digital conversion circuit according to claim 19, wherein the reference voltage generation circuit includes a plurality of voltage dividing elements connected in series between a supply terminal of a first reference voltage and a supply terminal of a second reference voltage, the first reference voltage, the second reference voltage, and a plurality of divided voltage generated on respective series connection nodes of said plurality of voltage dividing elements are generated as said plurality of reference voltages.

* * * * *